United States Patent

[11] 3,610,750

[72] Inventors Robert E. Lewis
Palo Alto;
Melvin D. Wright, San Jose; Philip E. Chandler, Redwood City, all of Calif.

[21] Appl. No. 778,386
[22] Filed Nov. 25, 1968
[45] Patented Oct. 5, 1971
[73] Assignee Teledyne, Inc.
Hawthorne, Calif.

[54] METHODS AND APPARATUS FOR PHOTO-OPTICAL MANUFACTURE OF SEMICONDUCTOR PRODUCTS
16 Claims, 3 Drawing Figs.

[52] U.S. Cl. .......... 355/43,
355/53, 355/18, 355/54, 355/67
[51] Int. Cl. .......... G03b 27/70
[50] Field of Search .......... 315/40, 52;
95/12, 1; 355/53, 54, 67, 18, 43

[56] References Cited

UNITED STATES PATENTS

| | | | |
|---|---|---|---|
| 3,442,587 | 5/1969 | Croucher et al. | 355/54 |
| 3,476,476 | 11/1969 | Chitayat | 355/53 |
| 3,192,844 | 7/1965 | Szasz et al. | 355/78 |
| 3,399,593 | 9/1968 | Delp | 95/12 |
| 3,449,049 | 6/1969 | Harding et al. | 355/53 |
| 3,494,695 | 2/1970 | Sollima et al. | 355/53 |

*Primary Examiner*—Samuel S. Matthews
*Assistant Examiner*—D. J. Clement
*Attorney*—Flehr, Hohbach, Test, Albritton & Herbert

ABSTRACT: A microphoto pattern generator capable of reducing large scale artwork to finally reduced dimensions for single reduction, step-and-repeat printing on wafers or photosensitive plates. A reflection viewing system is provided for imaging the wafers or photosensitive plates in registry onto the artwork surface.

INVENTORS
ROBERT E. LEWIS
MELVIN D. WRIGHT
BY PHILIP E. CHANDLER
Flehr, Hohbach, Test,
Albritton & Herbert
Attorneys INVENTORS
ROBERT E. LEWIS
MELVIN D. WRIGHT
BY PHILIP E. CHANDLER
Flehr, Hohbach, Test, Albritton & Herbert
Attorneys INVENTORS
ROBERT E. LEWIS
MELVIN D. WRIGHT
BY PHILIP E. CHANDLER
Flehr, Hohbach, Test, Albritton & Herbert
Attorneys

METHODS AND APPARATUS FOR PHOTO-OPTICAL MANUFACTURE OF SEMICONDUCTOR PRODUCTS

BACKGROUND OF THE INVENTION

This invention relates to methods and apparatus for photo-optical manufacture of semiconductor products such as devices and integrated circuits, and more particularly to the production of final master photomasks or photogenerated wafer interconnections, made directly from large area original artwork depicting the desired patterns.

In semiconductor product manufacture and fabrication of circuit components such as transistors, FET's, integrated circuits and the like, it is conventional to utilize a series of photomasks which bear geometrical arrays of a suitable size for directly printing the required photoetching patterns onto the semiconductor wafer surface. A series of these patterns is utilized together with selective diffusion and other processes to develop the circuit. Typically, the circuit elements are initially drawn as layout drawings which are then used to prepare extremely precise photographically useful large scale artwork. Such artwork commonly consists of a transparent substrate overlaid with a photographically opaque, usually red, plastic sheet or coating which will bear the desired pattern. The pattern can be cut into such a coating or can be drawn with suitable equipment in red ink, or is formed by adhering black or red tape. Where the pattern is cut into a coating, the undesired portion is peeled off in selected areas to leave clear regions with the remaining sharply defined areas photographically opaque (red) to define the pattern. The cutting, inking or taping of these patterns is sometimes done by hand but more often is done by precision machinery. The artwork so formed is then photographically reduced in a series of steps to a final master photomask which is sued to make contact copies for contact printing against wafers. This photoreduction process generally is done in two steps in which the artwork pattern is stepwise reduced since the practical maximum one step reduction has heretofore been limited. Thus, a typical reduction of 200 to 1 has had to be made in two optical reductions. This limitation has resulted from the length of the camera bed required for such large reductions and the difficulty of obtaining uniform intense lighting over the large areas of the artwork. Each of the photomasks so produced ultimately must be sufficiently accurate so as to exactly register with the patterns of other photomasks so that precise, well defined multilayered circuit patterns are formed on the wafer. If the photomasks fail to register precisely, degradation of the product quality results.

Two systems of making final photomasks for semiconductor processing are common. In one, an intermediate-scale mask is step and repeat generated so as to compose an entire array of circuit patterns repeated a sufficient number of times to cover the wafer after final reduction. This intermediate mask is then optically reduced down to the final photomask size. The other system utilizes an intermediate mask of a single pattern which is then step and repeat exposed during final reduction so as to generate the entire array of patterns in the final photomask. In the one exposure reduction method, a large array is made which is reduced to final semiconductor wafer size by a single lens in one or more reductions. This system often experiences problems due to lens defects such as aberrations and the limitations of obtainable image size. In step reduction systems the final reduction exposure itself is repeated to form the array and accordingly the field of view of the optics is never required to equal that required in the one step reduction. On the other hand, the mechanical motion required to produce this step and repeat motion must be held to extremely close dimensional tolerances, so close, in fact, as to be measured by the shift in wavelengths of light. In either case, the final photomask patterns must register to an extremely precise degree which requires even more precise tolerances in the machinery and optics used to produce these patterns and, in general, necessitates the preparation of each pattern to absolutely precise dimensions throughout their processing in order to assure that they will register in the final product.

Recent developments indicate the desirability of performing medium or large scale integrated circuit wiring by similar techniques. The patterns for such integrated circuit wiring relate to interconnection of different devices on a single wafer and obviously are directly related to the same patterns already existing on the wafer and can be produced by the above-mentioned step and repeat processes. This is to say that the interconnection of devices, i.e., the obtaining of integrated circuits, must necessarily be achieved within the same step and repeat coordinate system as the previously used photomasks which were used to make the circuits themselves. In the case of interconnection masks generated by one exposure reduction, the master large scale integration pattern or artwork being produced, usually by cutting techniques, must when reduced match components throughout the entire wafer or a significant portion thereof. When the step reduction method is used, the pattern may be generated at final size from an intermediate size by successive overlapping exposures of a dot or square to form a line as through writing the circuit interconnection. In some instances, it may be desirable to use a hybrid of the two methods, in which stock patterns connect a smaller number of integrated circuits according to certain test data, and larger subassemblies would be connected by line writing techniques. In either situation, the usefulness of conventional systems for producing such integrated circuit patterns is limited since the stepped reduction systems now utilized require a degree of absolute reproducibility which is extremely difficult to obtain in practice. Additionally, the use of such small masks requires precision mechanical aids to obtain registry with the wafer pattern, which requirement contributes to the cost and general complexity of the system.

A further limitation is inherent in the production of semiconductor products and results from the statistical fact that a certain number of components on a given wafer will be defective due to the existence of random imperfections located throughout the wafer. For individual circuits on single dies, this condition merely results in direct loss of yield. However, when large sections or chips of the wafer are utilized, such random imperfections prevent the economic use of preformed photomasks for producing interconnection patterns since the interconnection patterns will uniquely account for elements which must be selectively discarded.

There is, therefore, a need for new and improved methods and apparatus for the photo-optical manufacture of semiconductor products.

SUMMARY OF THE INVENTION AND OBJECTS

In general, it is an object of the present invention to provide a method and apparatus for photo-optically manufacturing semiconductor products which will overcome the above mentioned limitations and disadvantages.

Another object of the invention is to provide methods and apparatus of the above character which eliminate the need for intermediate photographic reductions of artwork and which provide for extremely precise preparation of final photomasks without requiring the use of precision machinery for obtaining absolute dimensional tolerances.

Another object of the invention is to provide methods and apparatus of the above character which are particularly adapted to the creation of large or medium scale integrated circuit patterns which utilize coded information provided from previous test operations indicating the characteristics of the previously prepared devices on a given semiconductor wafer.

Another object of the invention is to provide methods and apparatus of the above character which do not require mechanical contact with the wafer and are, accordingly, generally capable of full wafer salvage without damage as compared to mechanical methods of integrating circuits, such as gap filling, scratch-through trimming and the like.

Another object of the invention is to provide methods and apparatus of the above character which provide for the discretionary wiring of integrated circuits by photoetch processes so that the resulting interconnections can jump or cross over other connections, as wire bonded connections are capable of doing, and which further provide a product which can be closely spaced and stacked with other circuits.

Another object of the invention is to provide methods and apparatus of the above character for forming interconnection patterns for integrated circuits wherein the image previously formed on the wafer surface is utilized to project a pattern which forms the basis of the interconnection pattern being prepared.

Another object of the invention is to provide methods and apparatus of the above character which provide a definite improvement in image quality, and the ability to perform discretionary wiring with photo techniques, and also reduction in the overall costs of operation.

The above and other objects of the invention are achieved by providing a system in which the full scale, large size artwork generated from the layout drawings of the pattern to be reproduced is reduced to the final image size in one optical reduction. Thus, the invention herein is characterized by the elimination of all intermediate reductions, intermediate photomasks and all other intervening sources of error and degradation in the production of semiconductor circuits. In the production of photomasks the artwork is optically and directly related to the photomask being produced in a single operation, and, likewise in the production of interconnection artwork, the wafer including its individual components are optically imaged directly onto the artwork surface. Thus, means are provided for supporting and illuminating an artwork surface and for imaging the same onto a sensitized photomask blank which can then be moved in step and repeat fashion so as to create an entire array of patterns. A series of such masks is then optically printed onto the wafer in sequence and the wafer is processed in such a manner as to produce the individual circuit components which are then tested by known techniques such as contact probe testing equipment. The results of the test may be recorded in any convenient manner such as by placing ink dots upon the wafer, or by placing magnetically sensible material on discrete portions of the wafer, or by an independent memory system. If desired, the characteristics of wafer components can be rectified by trimming procedures carried out with a triplane camera constructed according to one form of the invention. An image of the wafer to be integrated is then projected back onto the artwork surface and the image of the wafer itself is used as an outline to create discretionary artwork suitable for interconnecting its components. After completion of the preparation of suitable artwork, the wafer is exposed to a specular lighting through the artwork creative pattern of the final interconnection wiring. The integrated circuits wiring on the wafer is then developed and processed according to known techniques. This system is particularly useful in obtaining discretionary wiring and trimming for large and medium scale integration of many components on a single wafer.

These and other objects and features of the invention will become apparent from the following detailed description of the invention when taken in conjunction with the accompanying drawings.

DETAILED DESCRIPTION OF THE PREFERRED EMBODIMENTS

Figure 1:
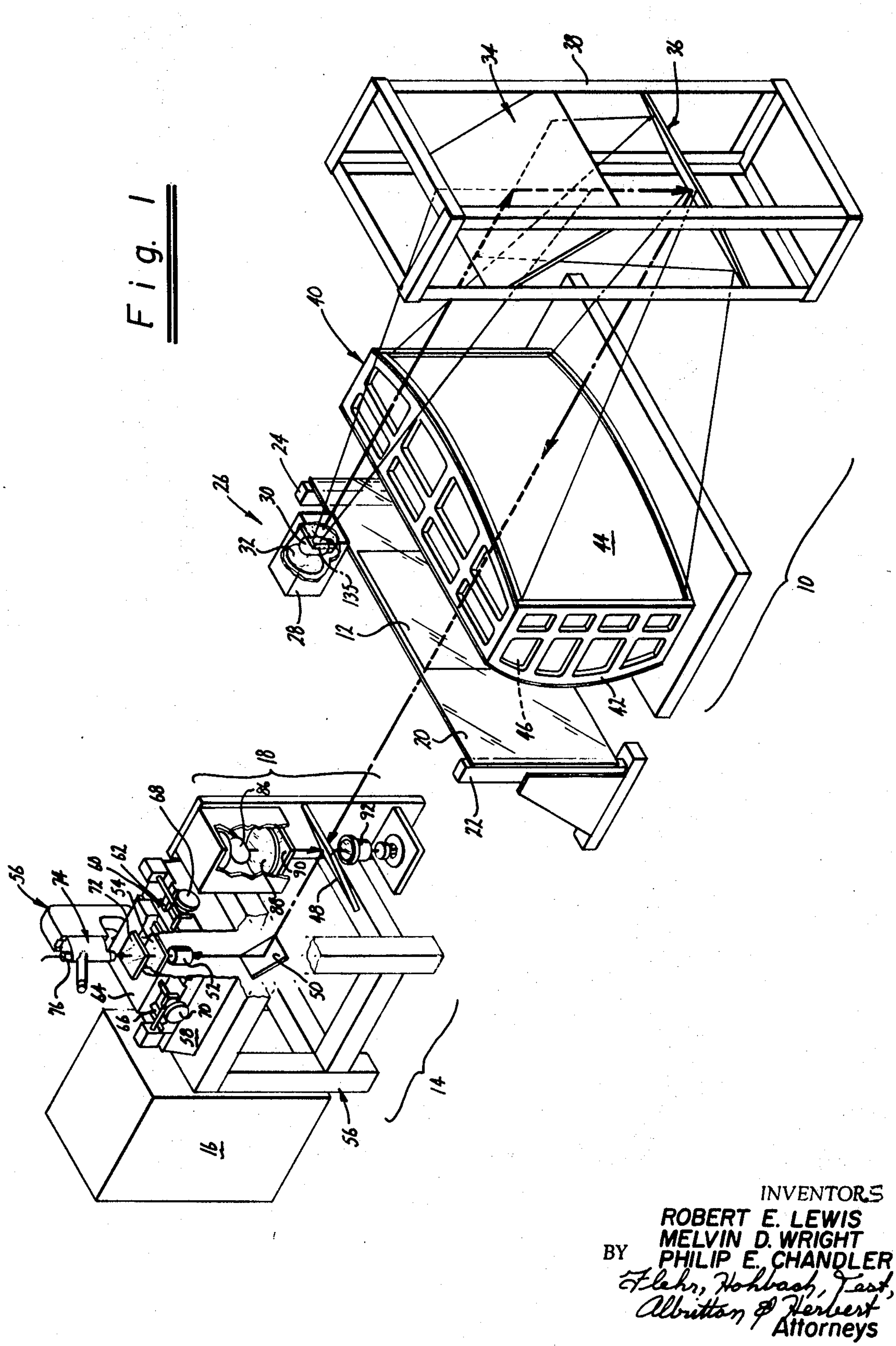
FIG. 1 is an isometric view, partly broken away, of photo-optical apparatus constructed according to the invention.

Referring particularly to FIG. 1, there is shown apparatus suitable for carrying out the invention which consists generally of a specular lighting arrangement 10 for illuminating a large original artwork 12, a step and repeat camera 14, control circuitry 16 and a projection microscope 18. The artwork 12 can be held by a glass plate 20 which supports a conventional transparent plastic substrate overlain with a coating cut to form the pattern which it is desired to reduce and print onto a photomask or onto a wafer. Thus, this artwork is the realization of the initial, precise rulings which carry out the layout instructions of the circuit designer and represent the original form of the desired pattern. The artwork includes suitable supporting structure which may take any of various forms such as the upright supporting stands 22, 24 shown.

Means are provided for specularly illuminating the artwork for through transmission of light and include a pulsed light source 26 which is suitably supported in a housing 28 and consists of a lamp 30, such as a Xenon, or mercury-type and a reflector 32 to enhance forward illumination. As used herein, specular light refers to nondiffuse lighting in which the rays travel along controlled directions according to a predetermined pattern as opposed to diffuse light. In order to save space, the output from the lamp can be redirected through a system of folding mirrors 34 and 36 mounted in a suitable frame 38 and is directed through a condensing lens 40 for transmission through the artwork 12.

The condensing lens 40 is preferably of a liquid filled type as disclosed in copending application Ser. No. 762,279, and entitled LARGE APERTURE LENS FOR PRECISION ARTWORK CAMERA, filed Sept. 16, 1968. The condensing lens generally consists of a hollow framework 42 defining a large aperture surrounded at each end by peripheral supporting surfaces conforming to simply curved contours. First and second transparent bendable planar sheets 44, 46 are supported on the contours in sealed relationship with the housing to form a liquid tight vessel for containing a suitable refractive liquid. This type of lens is preferred for use with the present invention due to its high optical quality and relatively low cost. However, it will be understood that other lens types could be adapted to the present application. For example, a solid glass lens could be utilized but the cost of production and annealing the same would appear prohibitive by present standards. Likewise, large Fresnel lenses could be utilized but with some degradation of quality due to shadows and nonuniform illumination resulting from the discontinuity between segments of such lenses. For further details of the construction of the liquid filled lens 40 of the type shown herein, reference is made to the above-referenced patent application wherein the construction is shown and explained in detail. By using a liquid filled lens of this type, it is found that highly uniform illumination of the entire artwork surface can be secured within a reasonable cost.

The use of projection microscope 18 will occur subsequent to the production of the initial photomasks for component production and accordingly a beam splitter 48 located within the microscope is removed for the present operation so that the light from the artwork impinges directly upon a reflective mirror surface 50 located within the step and repeat camera 14 where it is reflected upwardly through an objective lens 52 and focused into an image on the lower surface of a photosensitive plate 54. For the production of photomasks containing repeated similar patterns, such as are commonly used in the production of semiconductor devices, the objective lens will be of a magnification suitable for reducing the artwork completely to its final dimensions and typically is approximately 200*x* magnification. Thus, the image formed on plate 54 corresponds to the final image to be used and is transferred to a semiconductor wafer in later operations.

The step and repeat portion of the camera generally consists of a suitable supporting stand 56 which is rigidly mounted together with the artwork and the lighting system on a solid supporting floor (not shown) so that their relative positions remain constant. The stand supports a base 58 which carries a subcarriage 60 movable in a single direction on suitable guideways 62. A carriage 64 is set on the subcarriage and is movable transversely thereof on a second set of guideways 66. First and second electric motor driven screw means 68, 70 are provided for engaging the subcarriage 60 and carriage 64 independently so that they can be moved in either of two mutually perpendicular directions with respect to each other and to the base. These directions may be taken as an *x–y* axis frame of reference.

An aperture (not shown) is provided in each of the carriages for permitting the transmission of light from the objective lens to a position within carriage 64. Means is provided on the carriage for supporting photoplate 54 together with a precision ruled grid 72 in spaced-apart parallel planes in such a manner that the photosensitive surface of the photoplate is facing downwardly at the position of focus of the image formed by the objective lens while the precision ruled grid faces upwardly and is secured in rigid unitary relation to the photoplate through the body of the carriage itself. Suitable translation means such as a microscope stage is incorporated for orienting the relative positions of the plate and grid and for adjustably positioning the photoplate with regard to focus, displacement perpendicular to and rotation about the optic axis as well as for alignment with respect to movement of the carriages. Viewing of the photoplate plane for adjustment and focusing is accomplished by using nonactinic visible light so that the plate remains unexposed if it is in position. Optics are corrected for both the nonactinic and actinic wavelengths. A microscope 74 is supported on stand 56 above the ruled grid and contains a photosensitive element 76 and illumination means (not shown) for detecting the passage of a grid line across its field of view.

Photoplate 54 can take various forms and can consist, for example, of a wafer which has been coated with a photosensitive resist, or a glass plate containing a silver halogen emulsion (sometimes referred to as a high resolution plate) or a glass plate having a surface photoresist coating. The grid can be of any suitable type and, for example, can consist of a pattern of reflective material which is lined every one thousandths of an inch, which lines are sensed and counted by control circuitry 16. The photosensitive cell of the microscope is adjusted to fire the light source 26 at every *n*th count of grid lines. Preferably, though, the grid is ruled for exact centers and fired each time a ruling is sensed. This eliminates the counting step as well as errors resulting from miscounts. In situations where longer exposure is required it is preferred to stop the driving of the carriage during exposure.

In the production of photomask plates, suitable artwork 12 is prepared by drafting machines or otherwise to form a complete pattern which it is desired to step and repeat print while simultaneously reducing it to a size suitable for printing on wafers. Preferably, if peeling techniques are used, after the red layer is removed the artwork includes a photographically opaque whitish surface layer under the layer of contrasting color (red) to aid in viewing images projected upon the artwork. Such a layer can be a contact paper smoothly laid over the substrate. This type of artwork is especially adapted for use in a wide variety of applications wherein it is desired to use the artwork plane as a screen for viewing an enlarged image of the plane of the photosensitive plate. This artwork pattern is mounted in stands 22, 24 and a suitable reducing objective lens 52 is selected for use in the camera (~200*x*). Focus is commonly checked by utilizing a separate focusing slide which may be inserted in the camera with the grid removed to thereby permit microscope 74 to be used to adjust the relative positioning of the photoplate and the objective, after which a slide containing the grid and photoplate to be exposed is substituted in the carriage, the photoplate being so positioned at the same distance from the lens and automatically in focus, and rigidly held in relationship to the grid. The grid is utilized as a precision triggering mechanism for the firing of the lamp 30 to cause exposure of the photosensitive plate to a reduced image of the artwork during motor-driven translation of the carriage or subcarriage. One of the drive motors, for example the X motor, is energized to drive the carriage continuously in that direction. As the carriage moves the ruled grid 72 underneath the photosensitive element 76, a predetermined number of grid lines are traversed and counted until the predetermined repeat distance is summed. The location of the ruled line on the grid can be detected by transmitted or reflected light techniques. The counting circuit then triggers suitable power supply to cause the lamp 30 to be fired and an exposure made on the plate. This is repeated to form a sequence of exposures. The drive mechanism is sufficiently slow that an accurate reproduction of the artwork can be formed while the carriage is being continuously driven. After traverse of each line, the Y drive motor is energized for a sufficient time to step the carriage over to the next line and the X motor is then continuously driven for the next sequence of exposures. In this way, a rasterlike development of the photoplate is obtained. After the completion of the exposure of the requisite number of lines of the photoplate, it is taken out and processed to reveal its image. The artwork in position can then be changed to another pattern, a new photoplate inserted and the operation repeated. Typically, a minimum of five or six photomasks are produced for a given type of device. It should be emphasized that other exposure techniques can be used in the present invention. For example, the control circuitry can be set to stop the X motor for each lamp trigger pulse so that the photoplate is stopped and then exposed before proceeding. This may be necessary where large exposure times are required.

It is an important feature of the present invention that the photomasks produced by the operation just described are accurately and positively formed in identical registry without requiring bringing them to any absolute tolerances. For, the markings on the grid 72 or trigger plate are accurately followed in the manufacture of each mask and registry is obtained by this operation in itself and by proper focusing. As each successive mask is prepared, the exposure is automatically positioned on exactly the same position as exposed in previous plates so that registration between photomasks is inherently provided by the system. Furthermore, the direct production of photomasks from the artwork eliminates many costly and time consuming steps together with associated apparatus previously required for the creation of intermediate size photographic reductions. The completed photomasks are used to fabricate wafers and typically an optical system is utilized in which the masks are successively imaged directly onto the wafer or, if desired, contact printing of the masks to produce glass plate photomasks for direct contact printing on wafers can also be utilized. In any event, the entire series of masks is used sequentially to produce wafers having circuit components formed thereon according to the patterns indicated directly from original large artwork.

It is conventional for such wafers to be tested by contact probers in which touch contact is made with each device or component on the wafer to determine its electrical characteristics. Such contact probers are presently available, an example being that manufactured and sold by Transistor Automation Corporation of Woburn, Massachusetts. The characteristics so found are compared with reference values and any component or device which does not measure up is commonly given a marking, such as an ink marking for visual recognition or a magnetic marking for magnetic recognition so that such components or devices can be eliminated from the final product.

For large or intermediate scale integration of the devices or components on the wafer which has been contact probed and coded with information, the wafer may be placed in the position previously occupied by a photoplate and below the grid. The artwork position will then contain interconnection networks or bus bars which it is desired to imprint upon the wafer. By way of example, it may be desired to frame each of the components which are not to be utilized with a shorting bar and for this purpose a suitable mask can be prepared and selectively exposed to those areas containing components to be shorted. Typical control circuit for this purpose preferably includes a suitable memory device utilized in conjunction with the contact prober to record positions found by the prober to be defective. The memory device then is directly coupled with the control circuitry 16 to automatically cause selective exposure of only those areas on the wafer which it is desired to modify.

It is also possible to employ line writing techniques utilizing the same direct printing approach provided by the present invention. Thus, if it is desired to print a line upon a given portion of the wafer, a suitable sized artwork is established and printed sequentially with the passing of each of the grid lines as the carriage of the camera is moved, or alternatively the Xenon lamp 30 can be replaced by a lamp providing continuous illumination and controlled with a shutter. In each of the above-described examples of operation, it will be noted that no intermediate reduction of artwork is used and nor are absolute dimensional tolerances utilized. Thus, the entire process is considerably simplified and its accuracy as well as the quality of the resulting components and circuits are greatly improved.

Figure 2:
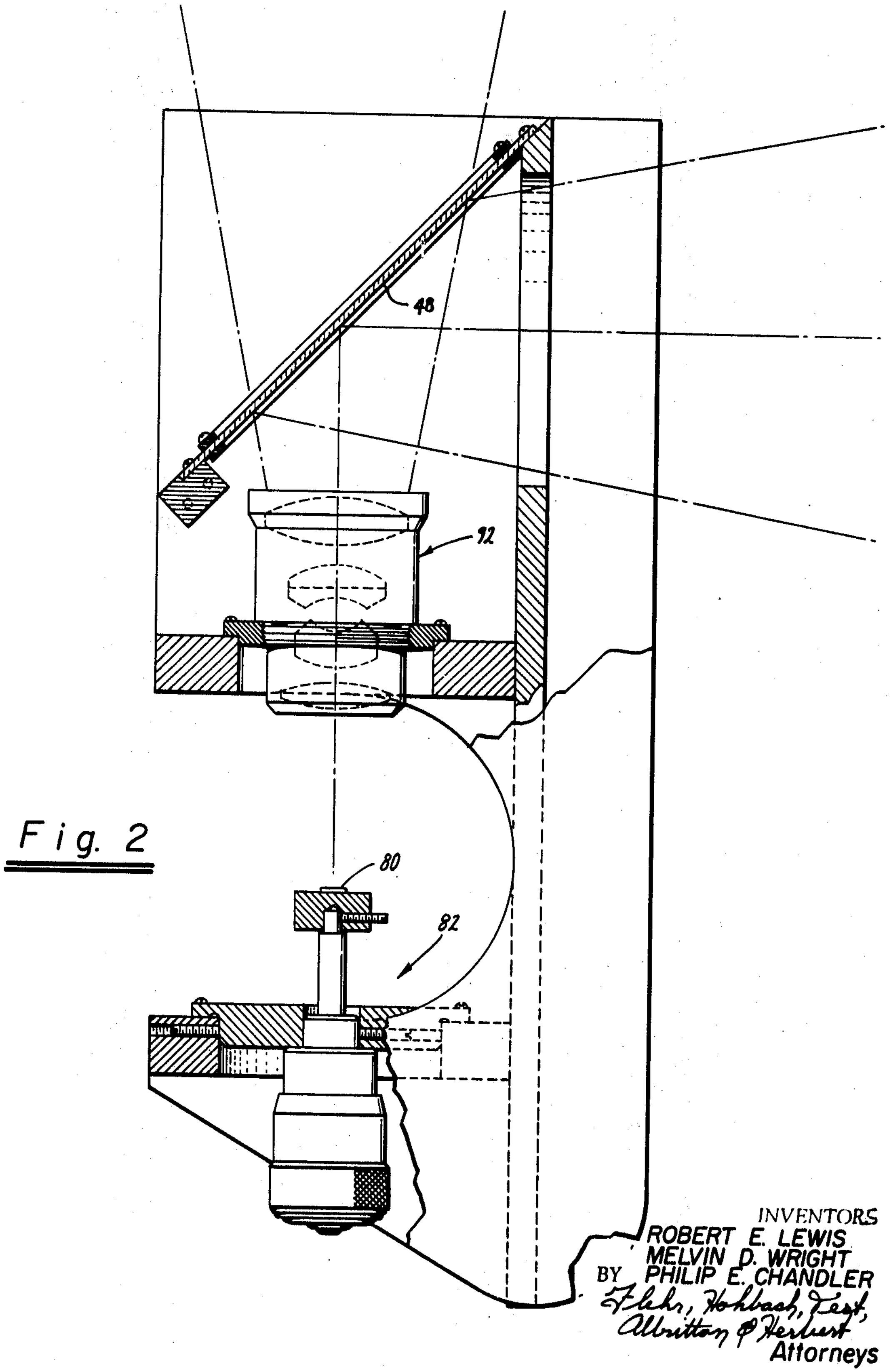
FIG. 2 is a cross-sectional view of a portion of the apparatus of FIG. 1.

Referring again to FIGS. 1 and 2, there is also illustrated a form of the invention particularly adapted for forming gross interconnection patterns on wafers such as are required in large scale and medium scale integration. Thus, there is provided a bright field illuminating device including the beam splitter 48 which is selectively interposed to intercept a beam received from the illuminated artwork. The construction of the device is shown in detail in FIG. 2 and consists of means for orienting and mounting a wafer 80 in a precisely positioned location at its lower end including a micrometer drive 82 on which the wafer is positioned and held by gravity or is held by vacuum. The upper surface of the wafer serves as an object surface for imprinting or recording information at the actual size of interconnection circuits to be placed upon the wafer, as will be explained. Optical means are provided for illuminating and imaging said entire object surface of the wafer onto the artwork from a forward direction and includes the beam splitter 48 which is disposed to provide an optical path to the artwork surface. Also included is a light source for illuminating the object surface of the wafer through the beam splitter. The source can conveniently include a lamp 86 and a condensing lens 88 as well as a suitable filter 90 for providing selective visual illumination of the wafer without exposing spectrally sensitive photoresist that may be coated thereon. An objective lens 92 is mounted for imaging light between the artwork and the wafer, or vice versa, and typically reduces the artwork about 20 times. The formation of large scale integrated circuits is greatly facilitated by the described operations.

Operation proceeds by imaging the wafer surface using bright field illumination from the lamp 86 which passes through the beam splitter 48 and objective lens 92 and is reflected by the wafer surface back to the reflective side 48 of the beam splitter and redirected toward the artwork plane. The artwork surface 12 can, for example, consist of a suitable transparent substrate with a white opaque peelable coating thereon, such as one of the adhesive backed cellophane or Mylar tapes. The pattern from the wafer is precisely focused on the tape and is directly used as the outline against which future pattern registry must be obtained. The formation of the desired pattern proceeds as it would with tracing paper. That is to say, the information from the wafer, together with the outline of its components and patterns, are imaged on the artwork surface and the artwork is merely cut to correspond to the desired interconnection pattern or disconnect pattern required for connecting the various components on the wafer into suitable circuits. The important feature of this system is that machine micromanipulation of patterns or drawing of patterns is not required but gross manipulation of pieces by hand is used to develop discretionary interconnection patterns directly from the image of the wafer itself. Multiple patterns or sets of patterns for a given wafer are in automatic registry and exact tolerance since all intermediate steps have been eliminated.

After the creation of the discretionary wiring artwork, lamp 86 is turned off and the wafer exposed by energizing lamp 30 together with the large aperture condensing optics 40. To shorten the exposure required, a mercury vapor lamp can be substituted for the Xenon lamp previously utilized at 30. Preferably, the filter 90 and the types of lamps 86, 30 can be selected such that the viewing light and the exposure light are at different wavelengths; the viewing light being nonactinic, while the exposure light is actinic. In this way, the wafer can be given a coating of photoresist and viewed on the artwork surface without exposing the coating to thereby eliminate the need for subsequent removal, coating and resetting the wafer after development of the artwork is finished. Additionally, objective lens 92 is preferably selected to be achromatized for the two selected wavelengths to avoid changes in magnification caused by the aberrations of lenses. Achromatized lenses of this type are known in the art and need not be further discussed. By using such a lens, the registry obtained in projecting the image of the wafer surface onto the artwork surface is maintained to an extremely high degree of accuracy despite the use of spectrally different light for viewing and exposing the wafer.

Figure 3:
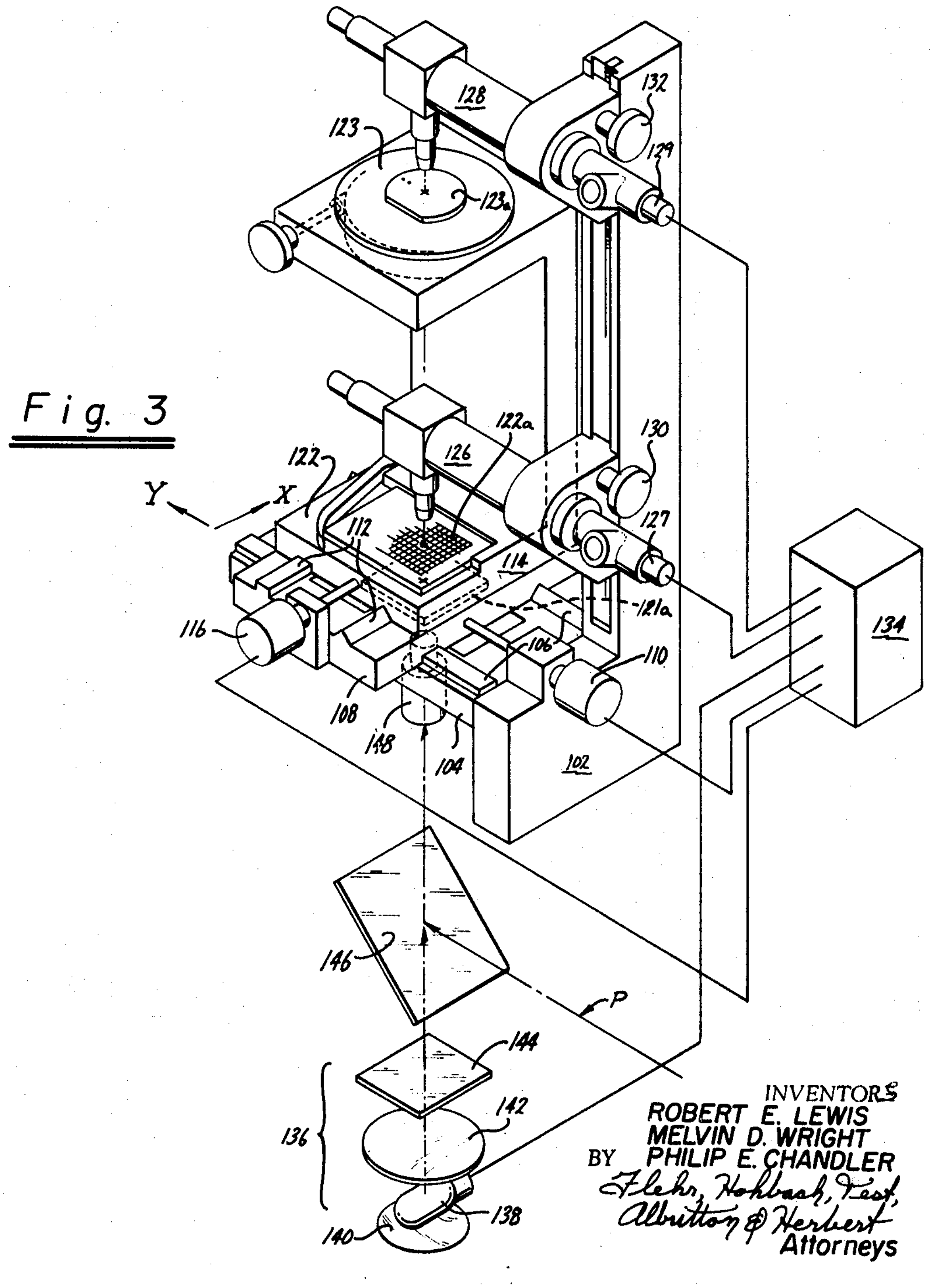
FIG. 3 is an isometric view, partly in diagrammatic form, of modified photo-optical apparatus for carrying out the invention and including a triplane camera.

Referring now to FIG. 3, there is shown a triplane camera 100 constructed according to the present invention for precise and selective step and repeat exposure of photosensitive surfaces and one step reduction of large artwork. This camera represents an additional degree of usefulness in that step and repeat creation of patterns can be undertaken while reading an information bearing source regarding the results of tests previously conducted on a given wafer. That is to say, it is possible with the camera of FIG. 3 to utilize test information directly encoded on the wafer for the purpose of developing suitable interconnection pattern for connecting various components thereon. In general, the apparatus substitutes for the step-and-repeat camera previously discussed in connection with FIG. 1. FIG. 3 shows the device in alignment with the light beam travelling along optic axis P from the artwork board. The specular illumination system previously discussed, as well as the artwork, are omitted from this Figure as unnecessary since their construction and operation remain the same as previously discussed.

The triplane camera comprises a suitably supported framework 102 including a horizontally extending table 104 which supports guideways 106 for a subcarriage 108. The subcarriage is driven back and forth along in the Y direction by a suitable electric motor driven screw 110. The subcarriage caries a second guideway 112 which extends transversely of the first 106 and on which is mounted a carriage 114 which is moved along the guideways in an X direction by an electric motor driven screw 116 as shown.

Carriage 114 incorporates first, second and third parallel planar stages 121, 122, 123, the first and second of which are supplied with X, Y and rotation-translation devices (omitted for clarity) for permitting the accurate positioning of items carried thereon. Alternatively, prealignment means can be provided to ensure that each element is precisely and reproducibly positioned. The lower stage 121 is fitted with a photographically sensitive mask plate 121*a* while the second stage 122 carries a ruled grid 122*a* similar to that (72) previously described. The third stage is adapted to support a wafer or planar surface 123*a* which has encoded thereon information indicating an instruction involving the condition of particular components. Such information is commonly in the form of colored dots or other indicia which indicate the response of particular circuit components on the wafer to contact-probe testing.

A suitable microscope 126 and sensor 127 is carried on the frame and extends over the grid 122*a* carried on the second stage for permitting visual registry and proper alignment of the grid together with sensing means for indicating movement of the carriage system as a whole, as each grid line or intersection is passed. An additional microscope 128 and sensing mechanism 129 is also carried on the frame and extends over the third stage for viewing and detecting information contained on the coded wafer. The microscopes 126, 128 are provided with suitable elevation screws 130, 132 for providing focus adjustment.

Means are provided for controlling exposure of the photosensitive surface in the first stage 121 and consists of suitable switching circuitry 134 which operates on a go, no-go basis for flashing the lamp 30 whenever a coincidence of grid lines (or a predetermined number of grid lines, if counted) and appropriately coded position on the wafer occurs. Alternatively, a shutter 135 can be provided for opening the light path from lamp 30 each time an exposure is desired. By using a shutter, the duration of the exposure can conveniently be controlled.

A bright field illuminator 136 is also provided and consists of a light tight housing containing a suitable lamp 138, reflector 140 as well as a condensing lens 142 and filter 144 which direct light through beam splitter 146 and the objective lens 148. Light from lamp 138 passes through condenser 142, filter 144, beam splitter 146 and objective 148 to be reflected back and redirected by the beam splitter to the artwork along axis P. This reflected light from the photosensitive surface is focused at the plane of the artwork surface (as in FIG. 1) so that exact registration of the photosensitive device with the artwork can be ascertained and modified. It is to be understood that there is no transfer of optical information between the three planes 121, 122, 123 of this camera. The planes are mechanically interrelated and unified by being mounted on very precisely supported carriage which is moved by the screw drive mechanisms in X and Y directions. Optical information is transferred between the lower surface of the first stage 121 of the carriage device and the artwork either by the bright field viewer 136 or by reverse illumination and the use of specular lighting transmitted through the artwork.

In general, the above apparatus produces microphotographic patterns on a photosensitive surface from large scale artwork by imaging the artwork and the pattern together with the objective lens. Nonactinic light is then reflected from the photosensitive surface and imaged onto the artwork surface to facilitate focusing and alignment. The artwork surface is then illuminated by through transmission with specular actinic light to selectively expose at least a portion of the photosensitive surface. After this, the photosensitive surface is moved a predetermined distance and again exposed. These steps are repeated at each grid intersection to create a precision of microphotographic mosaic of the artwork pattern on the photosensitive surface. In many instances more than one exposure of the same photosensitive surface can be used to overlap information of one pattern upon that of another. Or, the entire photopattern can be developed and processed before using a different set of artwork.

Operation of the triplane camera is as follows. A wafer 123*a* having coded thereon information regarding the electrical properties of its individual components in positioned in the top or third stage. This wafer will ultimately be integrated by a circuit pattern generated by the step and repeat exposure of a photomask in the first stage to information contained on one or more types of artwork positioned in the artwork plane. By way of example, assuming that three types of information are provided so the wafer, one in red, one in blue and one with no marking whatsoever, suitable sensing device 129 is established in the microscope of the third stage so that the existence of one of these conditions can be sensed. Artwork appropriate to printing on the wafer for a particular color code is mounted and aligned at the artwork board. The camera is then set to scan in X–Y by continuously moving the carriage so that the grid traverses a fixed point defined by the grid sensor A count of grid lines establishes correct spacing for potential flashing of the flash lamp 30 by circuitry 134 (a necessary condition) which is sensed. Upon coincidence of information from the other, sensor 129 flashes the exposure lamp through the artwork. In this way, all component regions of the wafer having the code for this artwork become exposed during the step and repeat scanning of the grid and wafer.

The system just described utilizes a wafer with suitable coding on the top or third stage of the triplane and a sensitive photoplate on the bottom or first stage. This implies the use of a conventional system of producing semiconductor devices. That is to say, upon the exposure and development of the photosensitive photoplate and subsequent exposure to a photoresist coated wafer, the wafer is conventionally processed. Another method consists of placing the wafer with a photoresist or photosensitive coating face down in a position 121*a* to substitute for the plate in the first stage. Previously, a mockup of the wafer can be created at the time in which it is contact-probed and this mockup is positioned with suitable coding information at a position 123*a* previously occupied by the wafer in the third stage. Again viewer 136 is utilized to orient the wafer with regard to the trigger plate so that plane to plane, point to point correspondence is achieved. The mockup may consist of any suitable device for recording instructions for processing the wafer as a result of the contact-probe interrogation, and can, for example, be a photographic plate which is selectively exposed. The triplane camera then operates in the same manner previously discussed in connection with the camera 14 of FIG. 1 except that the wafer is directly exposed to the image of the artwork without any kind of intervening mask or any costs connected with making the same.

From the above description it will be apparent that our new method and apparatus for photo-optical manufacture of semiconductor products is of great value in facilitating the manufacturing and processing of microcircuits and particularly of such manufacture without the use of intermediate photographic reductions of artwork. Thus, previously experienced serious problems with maintaining photograph quality and accuracy have been obviated by a direct one-step reduction and step and repeat production of images at the finally desired size. The invention can be used in a wide variety of applications as for producing direct patterns on wafers or for production of photoplates for one-to-one photoprinting or contact printing on wafers.

To those skilled in the art to which this invention relates, many changes and differing embodiments and application of the invention will suggest themselves without departing from their spirit and scope. For example, although the description herein illustrated reflection optics for sensing grid lines, it will be obvious that transmission optics can be directly and readily substituted. Furthermore, although the mechanical/optic system of the triplane camera shown herein indicates colinearity between respective points in the three planes due the there mechanical relationship, it should be understood that this is not a requisite and noncolinear structures could be substituted. Accordingly, it is to be understood that the disclosures and descriptions given herein are not to be taken as limiting the invention, but rather, are to be taken in an illustrative sense.

We claim:

1. A triplane camera for precise and selective step and repeat exposure of a photosensitve surface, means mounting said photosensitive surface, a large artwork surface bearing the pattern to be photoreduced, optical means imaging said artwork surface onto said photosensitive surface, lighting means for flash illuminating the artwork surface for through transmission of light to said photosensitive surface, step and repeat means for carrying said photosensitive surface and for precisely shifting the same in predetermined increments and for controlling the lighting means to expose said surface only in predetermined spaced positions thereon, said step and repeat means including a base, a first guideway carried on the base, a subcarriage carried on the guideway, a second guideway carried on the subcarriage, and a unitary carriage carried on said second guideway, said guideways being oriented at right angles to each other, first and second motor driven screw means connected to said subcarriage and carriage respectively, said unitary carriage supporting first, second, third stages positioned in spaced-apart parallel relation, said first stage carrying said photosensitive surface device, said second stage carrying a precision ruled grid, and said third stage carrying an information bearing source for indicating go, no-go exposure of said photosensitive surface at said first stage, means carried by at least two of said stages for aligning the material carried therein with respect to the third so that the material carried in said first, second and third stages can be precisely aligned with respect to each other, optically sensitive means for sensing increments established by the movement of said grid relative to said optically sensitive means, second optically sensitive means for sensing information carried on the surface of the material carried on said third stage, means connecting the output of each of said optically sensitive means in series to control the operation of said light source to thereby control exposure of said flashing said illuminating means and exposure of said photosensitive surface device.

2. A method for reproducing microphotographic patterns on a photosensitive surface from large scale artwork comprising the steps of imaging said artwork onto said pattern, reflecting nonactinic light of a first frequency from said photosensitive surface to image the same onto said artwork surface, aligning and focusing said photosensitive surface and artwork surface with said nonactinic light, illuminating said artwork surface by through transmission with specular, actinic light of a second frequency removed from said first frequency to thereby expose at least a portion of said photosensitive surface, cutting off (turning out) said actinic light and moving said photosensitive surface to a predetermined distance and again illuminating artwork with said actinic light to expose said photosensitive surface, repeating the steps for moving and exposing said photosensitive surface in a precision pattern to create microphotographic mosaic of said artwork pattern.

3. Method as in claim 2 further including the steps of changing said artwork and reexposing the photosensitive surface according to said changed artwork.

4. Method as in claim 2 further including the steps of testing of individual wafer characteristics at each position to be subsequently exposed and selectively exposing said photosensitive surface at each step-and-repeat position in accordance with test information obtained.

5. A precision photo-optical system for use in semiconductor manufacture comprising means forming a photosensitive surface capable of receiving an image and recording said image as a pattern thereon means mounting said photosensitive surface, means forming a large artwork surface bearing pattern to be photoreduced onto said photosensitive surface, objective lens means for imaging and reducing said artwork surface into a microimage at the surface of said photosensitive surface, lighting means for imaging and reducing said artwork surface into a microimage at the surface of said photosensitive surface, lighting means for selectively illuminating the artwork by transmitted light and including a light source and condensing optics imaging said source through said artwork and upon said objective lens whereby said artwork is reduced by said objective lens to the final designed size of the micro image pattern to be formed at said photosensitive surface, a ruled grid having two sets of spaced-apart lines thereon forming an intersecting grid, said lines being ruled for exact centers so that each intersection represents an exposure location, means mounting said photosensitive surface and said ruled grid and spaced parallel planes as a unitary structure, said means including a carriage adapted for movement along said first and second intersecting guideways whereby the rulings of said grid can be selectively passed by a point in space, optically sensitive means directed toward said grid for sensing intersections established on said grid as the same moves past said spacial point, means responsive to the output of said optically sensitive means for flashing said lighting means to thereby cause exposure of said photosensitive plate each time a gridline is sensed.

6. Apparatus as in claim 5 further including projection means for projecting an image of said photosensitive surface by nonactinic light onto said artwork surface, and further in which said artwork surface includes means for rendering said projected image visible whereby said surface can be manipulated by nonactinic light in register with said photosensitive surface, said projection means including a beam splitter whereby said photosensitive surface can be exposed by actinic light from said lighting means.

7. Apparatus as in claim 6 wherein said artwork surface contains opaque portions consists of a diffusively reflective surface rendering patterns projected thereon visible to a nearby observer.

8. A triplane camera for precise and selective step and repeat exposure of a photosensitive surface, means mounting said photosensitive surface, a large artwork surface bearing the pattern to be photoreduced, optical means imaging said artwork surface onto said photosensitive surface, lighting means for flash illuminating the artwork surface for through transmission of light to said photosensitive surface, step and repeat means for carrying sad photosensitive surface, and for precisely shifting the same in predetermined increments and for controlling the lighting means to expose said surface only in predetermined spaced positions thereon, said step and repeat means including a unitary carriage supporting first, second, and third stages positioned in spaced-apart parallel relation to each other, said first stage carrying said photosensitive surface, a precision ruled grid carried in said second stage and an information bearing source for indicating go, no-go exposure of said photosensitive surface and carried in said third stage means carried by at least two of said stages for aligning said information bearing source said grid and said photosensitive surface with respect to each other in a precise relationship optically sensitive means for sensing increments established by the movement of said grid relative to said optically sensitive means, second optically sensitive means for sensing information carried on the surface of said information bearing third surface means connecting the output of each of said optically sensitive means in series to control the operation of said light source to thereby cause exposure by flashing of said lighting means upon coincidence of go indication in said third stage and the intersection of a line on said grid.

9. Apparatus as in claim 8 further including a light source of a visible nonactinic light constructed in a range to illuminate said photosensitive surface, a beam splitter to split as between last named light source and said surface and including a first mirror surface for reflecting light from said photosensitive surface to said artwork.

10. Apparatus as in claim 8 in which a probed wafer bearing go, no-go marks indicating test probe results of said wafer is carried in said third stage and in which said second sensing means is responsive to said marks for delivering an output signal indicative of either go, or no-go condition of a test position on said wafer.

11. Apparatus as in claim 8 further in which said information bearing or data carrying surface positioned at the third plane is provided with indicia thereon for spacially related in correspondence with said tested wafer whereby online, real time use of said indicia exposes successive layers of LSI interconnection masks in successive step and repeat runs.

12. A precision photo-optical system for microimage pattern generation comprising means forming a photosensitve surface capable of receiving a pattern, means forming an artwork pattern to be reproduced on said photosensitive surface, objective lens means for imaging and reducing said artwork pattern into a microimage on said photosensitive surface, lighting means for selectively illuminating the artwork by transmitted light and including a light source smaller than the artwork and condensing optics imaging said source through said artwork upon the objective lens system for reducing said artwork to the final desired size of the microimage pattern, step and repeat means for shifting said photosensitive surface and for controlling the light means to expose said surface only at predetermined spaced positions as said surface is shifted, a light source of visible nonactinic light constructed and arranged to illumine said photosensitive surface, a beam splitter disposed between said last named light source and said surface including a plane parallel mirror and a second first surface plane mirror to said high resolution objective so that reflections from said photosensitive surface are redirected by said first surface plane mirror to said artwork.

13. Precision photo-optical system as in claim 12 in which said artwork consists of a planar transparent substrate supporting surface having an overlay thereon consisting of an opaque whitish surface for receiving light projected from said photosensitive surface and forming a visible diffusely illuminated image thereof upon said opaque surface whereby exact registration can be obtained between patterns formed in said opaque surface and patterns existing on said photosensitive surface.

14. An electrophoto-optical step and repeat camera for production of microphotographic patterns comprising large scale artwork including an opaque pattern supported on a transparent substrate, a light source, means for controlling the output of said light source to selectively illuminate said artwork by transmitted light, means forming a photosensitive surface, a high resolution objective lens for receiving light transmitted through said artwork and for forming a reduced microcircuit image thereof upon said photosensitive surface, a ruled grid having spaced intersections thereon corresponding to the desired spacing of each microcircuit image, means mounting said photosensitive surface and grid in spaced parallel planes and in unitary relationship for movement in two directions in said plane to locate exposure stops thereon with respect to the artwork image, means for sensing the passage of an intersection of said ruled grid and for operating said light output controlling means, a light source of visible nonactinic light constructed and arranged to illumine said photosensitive surface, a beam splitter disposed between said last named light source and said surface plane mirror to said high resolution objective so that reflections from said photosensitive surface are redirected by said first surface plane mirror to said artwork.

15. An electrophoto-optical step and repeat camera as in claim 14 in which said second light source comprises a lighttight housing, a visible light source, condensing lens and a light filter arranged in series in said cabinet, said light filter serving to remove photographically active light from the rays of said light source system prior to passage from housing.

16. A method for operating a precision photo-optical system of the type comprising means forming a photosensitive surface capable of receiving a pattern, means forming an artwork pattern to be reproduced on said photosensitive surface, objective lens means for imaging and reducing said artwork pattern into a microimage on said photosensitive surface, lighting means for selectively illuminating the artwork by transmitted light and including a light source smaller than the artwork and condensing optics imaging said source through said artwork upon the objective lens system for reducing said artwork to the final desired size of the mircoimage pattern, step and repeat means for shifting said photosensitive surface and for controlling the light means to expose said surface only at predetermined spaced positions as said surface is shifted, a light source of visible nonactinic light constructed and arranged to illumine said photosensitive surface, a beam splitter disposed between said last-named light source and said surface including a plane parallel mirror and a second first surface plane mirror to said high resolution objective so that reflections from said photosensitive surface are redirected by said first surface plane mirror to said artwork, and in which said artwork consists of a planar transparent substrate supporting surface having an overlay thereon consisting of an opaque whitish surface for receiving light projected from said photosensitive surface and forming a visible diffusely illuminated image thereon upon said surface opaque surface wherein exact registration can be obtained between patterns formed in said opaque surface and patterns existing on said photosensitive surface including the steps of projecting an image of the photosensitive surface by nonactinic light onto said artwork overlay, preparing an interconnection network on said overlay in registry with the image thereon, turning off said nonactinic light and thereafter projecting with actinic light said artwork onto said photosensitive surface to thereby expose said surface with the image of said artwork in substantial registration.